United States Patent
Zhang et al.

(10) Patent No.: US 8,878,545 B2
(45) Date of Patent: Nov. 4, 2014

(54) TEST APPARATUS WITH PHYSICAL SEPARATION FEATURE

(75) Inventors: Jie Zhang, Shanghai (CN); Zhiyong Zhang, Shanghai (CN); Shouyin Ye, Shanghai (CN); Jianhua Qi, Shanghai (CN)

(73) Assignee: Sino IC Technology Co., Ltd., Shanghai (CN)

( * ) Notice: Subject to any disclaimer, the term of this patent is extended or adjusted under 35 U.S.C. 154(b) by 0 days.

(21) Appl. No.: 13/504,548

(22) PCT Filed: May 17, 2011

(86) PCT No.: PCT/CN2011/074142
§ 371 (c)(1),
(2), (4) Date: Apr. 27, 2012

(87) PCT Pub. No.: WO2012/155334
PCT Pub. Date: Nov. 22, 2012

(65) Prior Publication Data
US 2014/0070816 A1  Mar. 13, 2014

(51) Int. Cl.
  *G01R 13/34* (2006.01)
  *H01R 3/00* (2006.01)
  *G01R 31/28* (2006.01)
  *G01R 1/02* (2006.01)
  *G01R 1/18* (2006.01)

(52) U.S. Cl.
  CPC .............. *G01R 1/02* (2013.01); *G01R 31/2879* (2013.01); *G01R 1/18* (2013.01)
  USPC .......... 324/537; 324/76.38; 439/488

(58) Field of Classification Search
  CPC .......... G01R 1/18; G01R 31/2879; G01R 1/02
  USPC ................. 324/537, 76.38; 439/488
  See application file for complete search history.

(56) References Cited

U.S. PATENT DOCUMENTS

2002/0052146 A1\* 5/2002 Custer et al. .................. 439/625
2010/0201386 A1\* 8/2010 Roelvink ....................... 324/754
2011/0074457 A1  3/2011 Roderick et al.

FOREIGN PATENT DOCUMENTS

CN  101266262 A1  9/2008
CN  101398461 A1  4/2009

\* cited by examiner

*Primary Examiner* — Jermele M Hollington
*Assistant Examiner* — Farhana Hoque
(74) *Attorney, Agent, or Firm* — MKG, LLC

(57) ABSTRACT

A test apparatus with physical separation feature is disclosed. The test apparatus includes probes (210), a peripheral circuit (220), a circuit of special function (230), wherein the peripheral circuit and the circuit of special function are separately arranged on different circuit boards (240, 250). The peripheral circuit and the circuit of special function are both electrically connected to the probes. In the test apparatus with physical separation feature, the peripheral circuit and the circuit of special function are separated in physical spaces, so that interference between the components is prevented and the testing cost is reduced.

7 Claims, 4 Drawing Sheets

US 8,878,545 B2

TEST APPARATUS WITH PHYSICAL SEPARATION FEATURE

CROSS-REFERENCES TO RELATED APPLICATION

This is a non-provisional application claiming the benefit of International Application Number PCT/CN2011/074142 filed May 17, 2011.

TECHNICAL FIELD

The present invention relates to the field of chip testing, and more particularly, to a test apparatus with physical separation feature.

BACKGROUND ART

A chip test apparatus generally includes probes, a peripheral circuit and a circuit of special function. The peripheral circuit is used to measure performance parameters of the chip and the circuit of special function is used to apply special treatment to the chip. In the prior art, the probes, the peripheral circuit and the circuit of special function of a test apparatus are arranged on the same circuit board, namely the probes, the peripheral circuit and the circuit of special function of a test apparatus are arranged in the same plane. As a result, the density of components on the circuit board is high, and interference between the components is likely to occur. Moreover, the entire test apparatus must be discarded and replaced by a new one even when only one circuit on the circuit board is damaged, causing a high testing cost.

Take fuse reconditioning as an example, in order to optimize the performance of a chip, reconditioning of the chip fuses is often needed to select suitable internal circuit modules. Fuse reconditioning includes the steps as follows: measure parameters of the chip; select the fuses to be reconditioned based on the measurement results of the chip parameters; melt the selected fuses. Accordingly, a test apparatus for fuse reconditioning includes probes, a peripheral circuit for measuring chip parameters, and a fuse melting circuit (circuit of special function) for melting a selected fuse.

FIG. 1 illustrates a test apparatus for fuse reconditioning of the prior art. The test apparatus includes a circuit board 110, probes 120, a peripheral circuit 130 and four fuse melting circuits 140. In this example, the test apparatus for fuse reconditioning includes four fuse melting circuits 140 (namely four circuits of special functions) so that fuse reconditioning can be applied to four chips at the same time. The circuit board 110 has a round hole formed in it. The probes 120 are arranged in the round hole via a probe mount 160. The peripheral circuit 130 and the four fuse melting circuits 140 are all arranged on the circuit board 110. The circuit board 110 also has probe pins 150 arranged on it, and the number of probe pins 150 is equal to the number of probes 120. Each probe pin 150 is electrically connected to a probe 120. In this example, the probe pins 150 are arranged in a circle surrounding the probes 120. The peripheral circuit 130 and the four fuse melting circuits 140 are electrically connected to the probe pins 150 through wires (not shown in FIG. 1), and thus electrically connected to the probes 120. Those probes 120 electrically connected to the peripheral circuit 130 are used to measure chip parameters, while those probes 120 electrically connected to the fuse melting circuits 140 are used to melt fuses of the chips.

In the test apparatus for fuse reconditioning of this example, five circuits (a peripheral circuit 130 and four fuse melting circuits 140) are arranged on the same circuit board 110, resulting in a relatively high density; further, all the probes 120 are arranged in the same circle (with only small gaps between neighboring probes), so that interference between the probes is likely to occur; additionally, even when only one of the five circuits is damaged, the test apparatus must be discarded and be entirely replaced by a new test apparatus for fuse reconditioning, leading to a high testing cost.

SUMMARY OF THE INVENTION

An objective of the present invention is to provide a test apparatus with physical separation feature, in which a peripheral circuit and a circuit of special function are separated from each other in physical spaces, so as to prevent interference between the components and reduce the testing cost.

To achieve the above objective, the present invention provides a test apparatus with physical separation feature, which includes probes, a peripheral circuit and a circuit of special function; the peripheral circuit and the circuit of special function are separately arranged on different circuit boards; the peripheral circuit and the circuit of special function are both electrically connected to the probes.

In the above test apparatus with physical separation feature, wherein probe pins are arranged on the circuit board where the probes are arranged on; the probe pins surround the probes; each probe pin is electrically connected to one probe; the peripheral circuit and the circuit of special function are both electrically connected to the probes via the probe pins.

In the above test apparatus with physical separation feature, wherein the probe pins are divided into two groups, respectively probe pins for peripheral circuit and probe pins for circuit of special function; probe pins of the same group are distributed in a same circle; probe pins of different groups are distributed in different circles; central angles subtended by arcs formed by the probe pins of different groups do not overlap with each other.

In the above test apparatus with physical separation feature, the peripheral circuit and the probes are arranged on the same circuit board.

In the above test apparatus with physical separation feature, wherein the test apparatus further includes a connection circuit board; the connection circuit board is electrically connected to the probes. The circuit board with the circuit of special function arranged thereon is electrically connected to the connection circuit board, so as to realize the electrical connection between the circuit of special function and the probes.

In the above test apparatus with physical separation feature, the probes, the peripheral circuit and the circuit of special function are separately arranged on different circuit boards. The test apparatus further includes a connection circuit board, and the connection circuit board is electrically connected to the probes. Both the circuit board with the circuit of special function arranged thereon and the circuit board with the peripheral circuit arranged thereon are electrically connected to the connection circuit board, so that the circuit of special function and the probes as well as the peripheral circuit and the probes are electrically connected.

The test apparatus with physical separation feature of the present invention arranges the peripheral circuit and the circuit of special function on different circuit boards to separate the peripheral circuit from the circuit of special function in physical spaces, thus reducing the density of components on a circuit board and preventing interference between the components. In addition, when a circuit of the test apparatus is damaged while the other circuits can still work normally, we need only replace the circuit board on which the damaged circuit is arranged rather than the entire test apparatus, and thereby reducing the testing cost.

DETAILED DESCRIPTION

The test apparatus with physical separation feature of the present invention will be further described by reference to FIG. 2 to FIG. 6.

The test apparatus with physical separation feature of the present invention includes probes, a peripheral circuit and a circuit of special function. The peripheral circuit is used to measure performance parameters of a chip and the circuit of special function is used to apply special treatment to the chip. The peripheral circuit and the circuit of special function are arranged on different circuit boards. The peripheral circuit and the circuit of special function are both electrically connected to the probes.

The test apparatus with physical separation feature of the present invention arranges the peripheral circuit and the circuit of special function on different circuit boards to separate the peripheral circuit from the circuit of special function in physical spaces, thus reducing the density of components on a circuit board and preventing interference between the components. In addition, when a circuit of the test apparatus is damaged while the other circuits can still work normally, we need only replace the circuit board on which the damaged circuit is arranged rather than the entire test apparatus, and thereby reducing the testing cost.

The test apparatus with physical separation feature of the present invention will be further described and specified by using embodiments.

Embodiment 1

Figure 1:
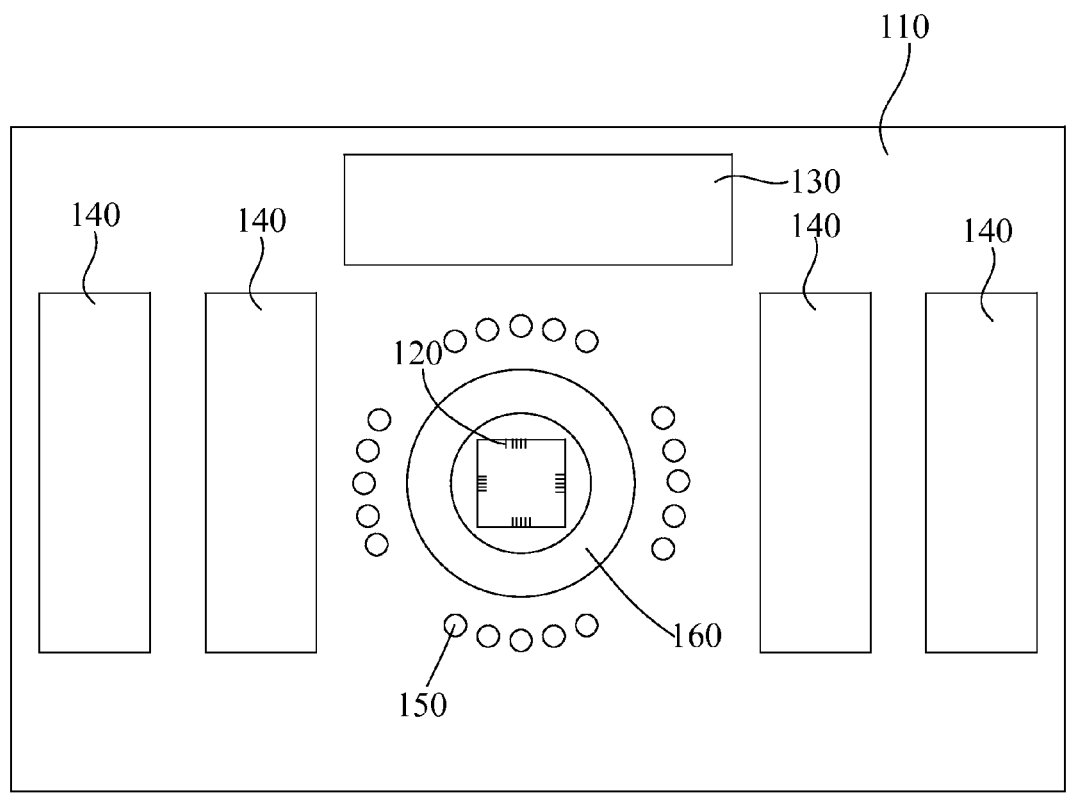
FIG. 1 is a schematic view of a test apparatus for fuse reconditioning of the prior art.
Figure 2:
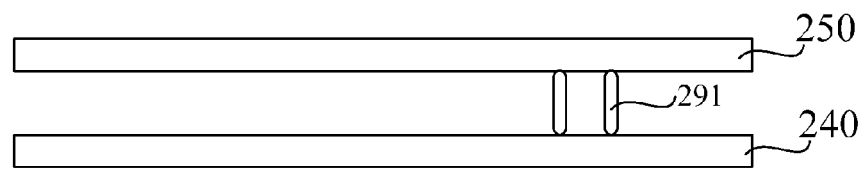
FIG. 2 is a schematic view of the test apparatus with physical separation feature according to Embodiment 1 of the present invention.
Figure 3:
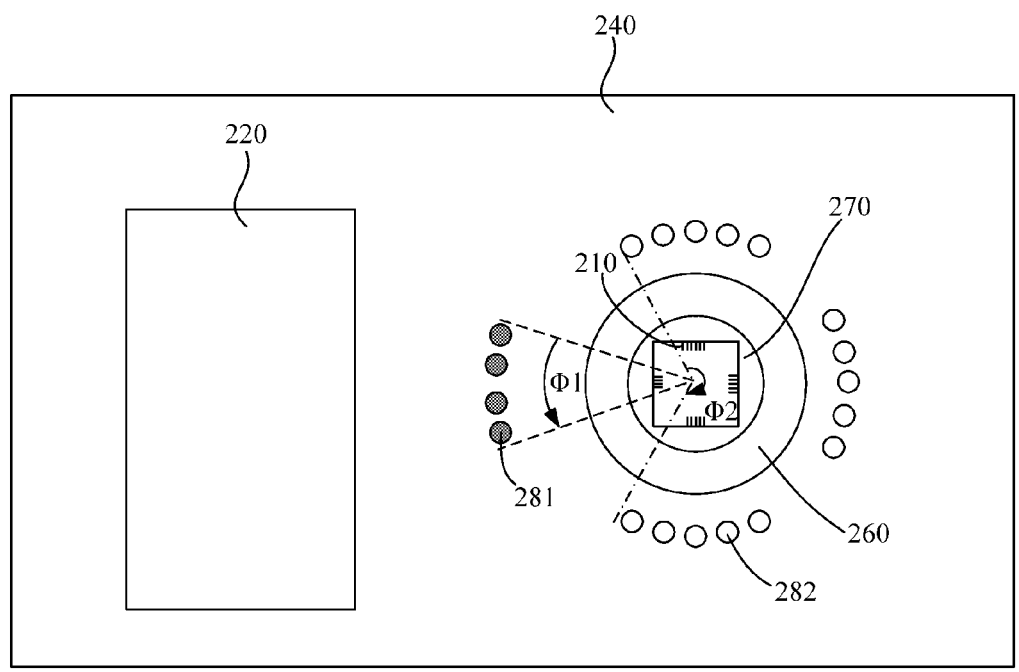
FIG. 3 is a schematic view of the first circuit board according to Embodiment 1 of the present invention.
Figure 4:
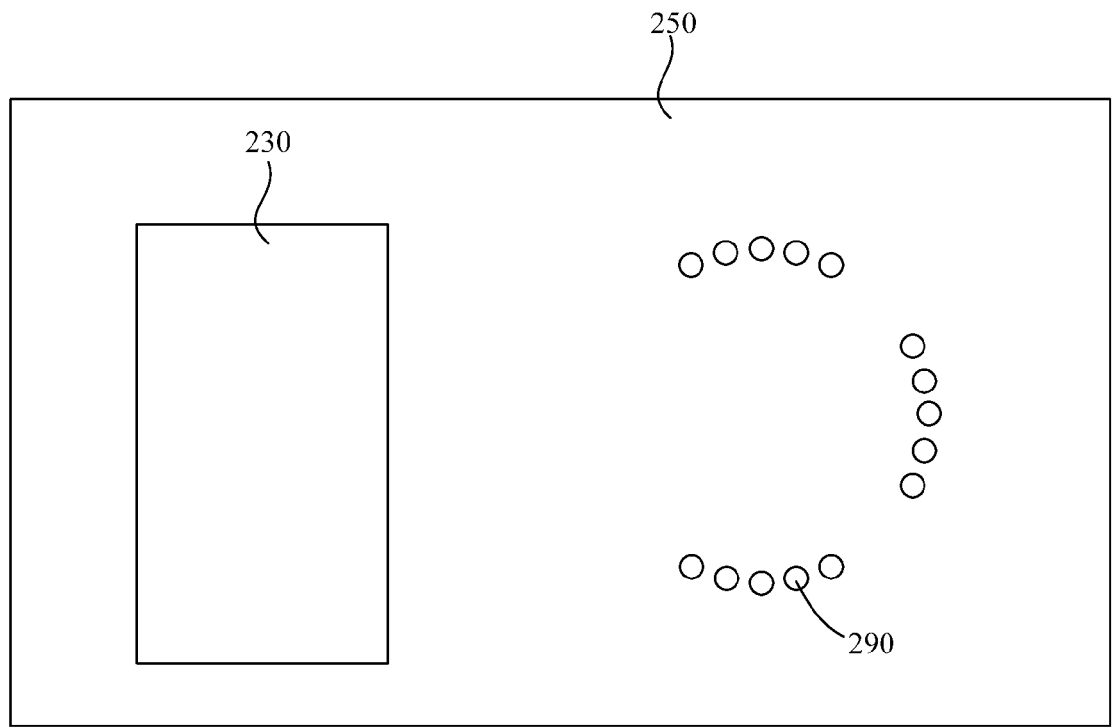
FIG. 4 is a schematic view of the second circuit board according to Embodiment 1 of the present invention.

Referring to FIG. 2 to FIG. 4, the test apparatus with physical separation feature of this embodiment includes a plurality of probes 210, a peripheral circuit 220 and a circuit of special function 230. The peripheral circuit 220 and the probes 210 are arranged on a first circuit board 240. The circuit of special function 230 is arranged on a second circuit board 250.

As shown in FIG. 3, a round hole is formed in the first circuit board 240 and an annular probe mount 260 is disposed in the round hole. The plurality of probes 210 are mounted onto the probe mount 260 through an insulating resin 270.

The peripheral circuit 220 is arranged on the first circuit board 240 and is on one side of the round hole.

The first circuit board 240 also has probe pins formed on it. The probe pins surround the probes 210.

The number of probe pins is equal to the number of probes 210. One probe pin is electrically connected to one probe 210. For ease of connection, one probe pin and one probe 210 are arranged corresponding to each other.

As shown in FIG. 4, the circuit of special function 230 is arranged on the second circuit board 250. Pins of circuit of special function 290 are also arranged on the second circuit board 250. The circuit of special function 230 is electrically connected to the pins of circuit of special function 290 via wires (not shown in FIG. 4). The pins of circuit of special function 290 are used to be connected to the probe pins on the first circuit board 240, so as to realize the electrical connection between the circuit of special function 230 and the probes 210.

The peripheral circuit 220 is electrically connected to the probe pins via wires (not shown in FIG. 3), so as to realize the electrical connection between the peripheral circuit 220 and the probes 210. The pins of circuit of special function 290 are electrically connected to the probe pins, so as to realize the electrical connection between the circuit of special function 230 and the probes 210. For example, the pins of circuit of special function 290 may be electrically connected to the probe pins via spring pins 291.

Since the peripheral circuit 220 and the circuit of special function 230 are separately arranged on different circuit boards in this embodiment, the density of components on a circuit board is largely reduced, which increases the flexibility in layout of components when designing a circuit board. In this embodiment, probe pins are divided into two groups, namely probe pins for peripheral circuit 281 and probe pins for circuit of special function 282. The probe pins for peripheral circuit 281 are used to be connected to the peripheral circuit 220 and the probe pins for circuit of special function 282 are used to be connected to the circuit of special function 230. Accordingly, the probes 210 are also divided into two groups, namely probes for peripheral circuit used to be electrically connected to the probe pins for peripheral circuit 281 and probes for circuit of special function used to be electrically connected to the probe pins for circuit of special function 282. Probe pins of the same group are arranged in a same circle and probe pins of different groups are arranged in different circles. Moreover, the central angles subtended by the arcs respectively formed by the probe pins of different groups do not overlap with each other. As shown in FIG. 3, in this embodiment, the probe pins for peripheral circuit 281 are distributed in a circle and the probe pins for circuit of special function 282 are distributed in another circle. The radius of the circle in which the probe pins for peripheral circuit 281 are distributed is greater than the radius of the circle in which the probe pins for circuit of special function 282 are distributed, and the central angle $\Phi 1$ subtended by the arc formed by the probe pins for peripheral circuit 281 does not overlap with the central angle $\Phi 2$ subtended by the arc formed by the probe pins for circuit of special function 282. Since the peripheral circuit 220 is arranged on one side of the round hole of the first circuit board 240, the probe pins for peripheral circuit 281 may be arranged on the side close to the peripheral circuit 220, and the probe pins for circuit of special function 282 may be arranged on the side far from the peripheral circuit 220. In the same way, the probes for peripheral circuit may be arranged on the side close to the peripheral circuit 220 and the probes for circuit of special function may be arranged on the side far from the peripheral circuit 220. The positions of the pins of circuit of special function 290 on the second circuit board 250 may be determined according to the positions of the probe pins for circuit of special function 282 on the first circuit board 240 to ensure convenience of connection.

As the peripheral circuit 220 and the circuit of special function 230 are arranged on different circuit boards, there is great flexibility in layout of the probe pins. Moreover, the probe pins are divided into two groups and the two groups are distributed separately; also the probes are divided into two groups and the two groups are distributed separately, so that the interference between the probe pins and/or the probes is greatly reduced.

As the peripheral circuit 220 and the circuit of special function 230 are arranged on different circuit boards, when one circuit is damaged, we only need to replace the circuit board where the damaged circuit is arranged on. There is no need to replace the entire test apparatus, so that the testing costs can be reduced.

Taking a test apparatus for fuse reconditioning capable of conducting fuse reconditioning to four chips at the same time as an example, the four fuse melting circuits may all be arranged on the second circuit board 250, namely regarding the four fuse melting circuits as an entirety (a circuit of special function).

Embodiment 2

Figure 5:
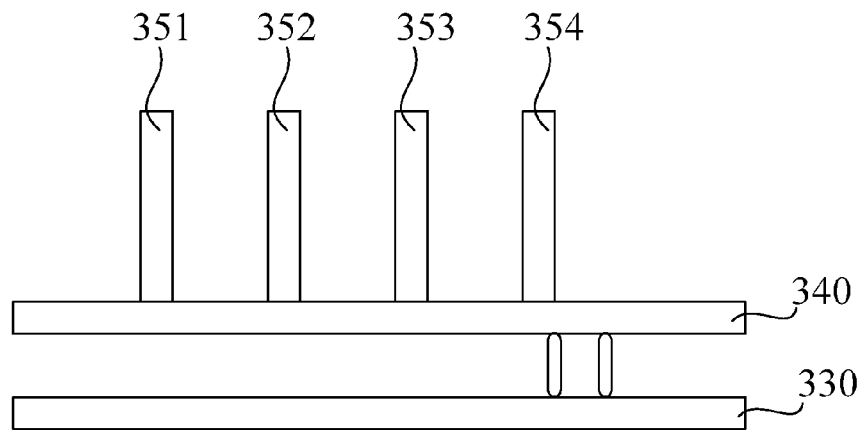
FIG. 5 is a schematic view of the test apparatus with physical separation feature according to Embodiment 2 of the present invention.
Figure 6:
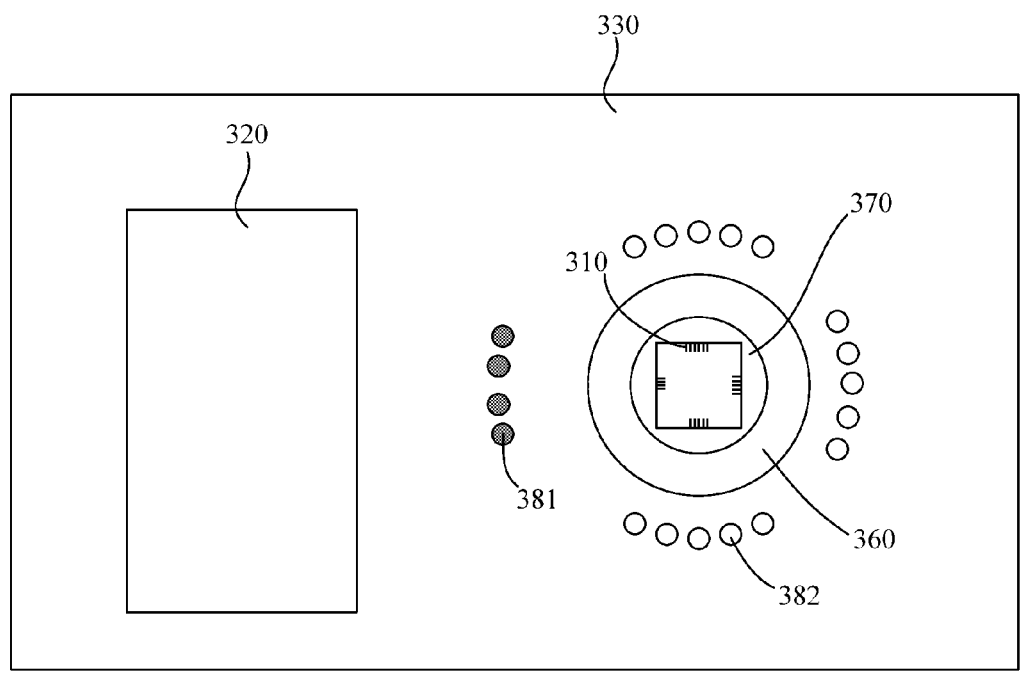
FIG. 6 is a schematic view of the third circuit board according to Embodiment 2 of the present invention.

Referring to FIG. 5 and FIG. 6, the test apparatus with physical separation feature in this embodiment includes a plurality of probes 310, a peripheral circuit 320, a connection circuit board 340 and four circuits of special functions. These four circuits of special functions include a first circuit of special function, a second circuit of special function, a third circuit of special function and a fourth circuit of special function.

The peripheral circuit 320 and the probes 310 are arranged on a third circuit board 330. The first circuit of special function is arranged on a fourth circuit board 351. The second circuit of special function is arranged on a fifth circuit board 352. The third circuit of special function is arranged on a sixth circuit board 353, and the fourth circuit of special function is arranged on a seventh circuit board 354.

As shown in FIG. 6, a round hole is formed in the third circuit board 330, and an annular probe mount 360 is disposed in the round hole. The plurality of probes 310 are mounted onto the probe mount 360 through an insulating resin 370.

The peripheral circuit 320 is arranged on the third circuit board 330, and is on one side of the round hole.

The third circuit board 330 also has probe pins formed on it. The probe pins surround the probes 310.

The number of probe pins is equal to the number of probes 310 and each probe pin is electrically connected to one probe 310. For ease of connection, each probe pin is arranged corresponding to one probe 310.

Similarly, in this embodiment, the probe pins are divided into two groups, namely probe pins for peripheral circuit 381 and probe pins for circuits of special functions 382. The peripheral circuit 320 is electrically connected to the probe pins for peripheral circuit 381 via wires (not shown in FIG. 6), so as to realize the electrical connection between the peripheral circuit 320 and the probes 310.

The fourth circuit board 351, the fifth circuit board 352, the sixth circuit board 353 and the seventh circuit board 354 are electrically connected to the probe pins for circuits of special functions 382 through the connection circuit board 340, so as to realize the electrical connections between the four circuits of special functions and the probes 310. For example, four sockets may be formed on the connection circuit board 340 and all these four sockets are electrically connected to the probe pins for circuits of special functions 382, so that each of the fourth circuit board 351, the fifth circuit board 352, the sixth circuit board 353 and the seventh circuit board 354 is connected to the connection circuit board 340 through one of the sockets.

The layout of the probe pins for peripheral circuit 381 and the probe pins for circuits of special functions 382 is the same with that in Embodiment 1.

Taking a test apparatus for fuse reconditioning capable of conducting fuse reconditioning to four chips at the same time as an example, the four fuse melting circuits may be respectively arranged on the four circuit boards.

In the above Embodiments 1 and 2, the peripheral circuit and the probes are arranged on the same circuit board, but it does not form a limitation to the present invention. The peripheral circuit and the probes may also be arranged on different circuit boards, such that both the peripheral circuit and the circuit of special function are electrically connected to the probes through the connection circuit board.

What is claimed is:

1. A test apparatus with physical separation feature, comprising:
   a first circuit board, comprising a peripheral circuit; and
   a second circuit board, comprising a circuit of special function,
   wherein the first circuit board further comprises:
      a probe mount having a plurality of first probes and a plurality of second probes mounted thereon;
      a plurality of first probe pins, each being electrically connected to a corresponding one of the plurality of first probes for electrically connecting the corresponding first probe to the peripheral circuit; and
      a plurality of second probe pins, each being electrically connected to a corresponding one of the plurality of second probes for electrically connecting the corresponding second probe to the circuit of special function,
   wherein the plurality of first probe pins are arranged in a first arc with a center at a center of the probe mount, wherein the plurality of second probe pins are arranged in a second arc with a center at the center of the probe mount, and wherein a central angle subtended by the first arc does not overlap with a central angle subtended by the second arc.

2. The test apparatus according to claim 1, wherein each of the plurality of second probe pins is electrically connected to the circuit of special function through a spring pin.

3. The test apparatus according to claim 1, further comprising a connection circuit board for electrically connecting each of the plurality of second probe pins to the circuit of special function.

4. The test apparatus according to claim 1, wherein the probe mount is of annular shape, each of the plurality of first and second probes being mounted on the probe mount using an insulating resin.

5. A test apparatus with physical separation feature, comprising:
   a first circuit board, comprising a peripheral circuit;
   a second circuit board, comprising a circuit of special function;
   a connection circuit board; and
   a third circuit board, comprising:
      a probe mount having a plurality of first probes and a plurality of second probes mounted thereon;
      a plurality of first probe pins, each being electrically connected to a corresponding one of the plurality of first probes for electrically connecting the corresponding first probe to the peripheral circuit via the connection circuit board; and a plurality of second probe pins, each being electrically connected to a corresponding one of the plurality of second probes for electrically connecting the corresponding second probe to the circuit of special function via the connection circuit board, wherein the plurality of first probe pins are arranged in a first arc with a center at a center of the probe mount, wherein the plurality of second probe pins are arranged in a second arc with a center at the center of the probe mount, and wherein a central angle subtended by the first arc does not overlap with a central angle subtended by the second arc.

6. The test apparatus according to claim 5, wherein the connection circuit board comprising a first socket for receiving the first circuit board and a second socket for receiving the second circuit board, each of the plurality of first probe pins being electrically connected to the peripheral circuit through the first socket, each of the plurality of second probe pins being electrically connected to the circuit of special function through the second socket.

7. The test apparatus according to claim 6, wherein the probe mount is of annular shape, each of the plurality of first and second probes being mounted on the probe mount using an insulating resin.

* * * * *